(12) United States Patent
Cheng

(10) Patent No.: US 10,204,929 B2
(45) Date of Patent: Feb. 12, 2019

(54) ARRAY SUBSTRATE AND DISPLAY DEVICE

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/539,770

(22) PCT Filed: Sep. 22, 2016

(86) PCT No.: PCT/CN2016/099721
§ 371 (c)(1),
(2) Date: Jun. 26, 2017

(87) PCT Pub. No.: WO2017/092485
PCT Pub. Date: Jun. 8, 2017

(65) Prior Publication Data
US 2018/0012907 A1 Jan. 11, 2018

(30) Foreign Application Priority Data
Dec. 1, 2015 (CN) .................... 2015 2 0977392 U

(51) Int. Cl.
*H01L 29/04* (2006.01)
*H01L 27/12* (2006.01)
(Continued)

(52) U.S. Cl.
CPC ...... *H01L 27/124* (2013.01); *G02F 1/136286* (2013.01); *G02F 2001/134318* (2013.01)

(58) Field of Classification Search
CPC .......................... H01L 27/124; H01L 27/1214
See application file for complete search history.

(56) References Cited

U.S. PATENT DOCUMENTS

2006/0164352 A1* 7/2006 Yoo ..................... G02F 1/13624
345/87
2011/0199550 A1  8/2011 Fan
2015/0261052 A1  9/2015 Morita et al.

FOREIGN PATENT DOCUMENTS

| CN | 101424804 A | 5/2009 |
| CN | 104360549 A | 2/2015 |
| CN | 205139543 U | 4/2016 |

OTHER PUBLICATIONS

International Search Report dated Dec. 30, 2016.

* cited by examiner

*Primary Examiner* — Samuel Gebremariam
(74) *Attorney, Agent, or Firm* — Dilworth & Barrese, LLP; Michael J. Musella, Esq.

(57) ABSTRACT

An array substrate and a display device are disclosed. The array substrate includes: a base substrate; gate lines and data lines disposed on the base substrate; and display units defined by intercrossing of the data lines and the gate lines, in which each display unit is provided with a thin-film transistor, a sub-pixel electrode and a common electrode line; and the common electrode line comprises a main electrode line, an extension direction of which is the same as an extension direction of the gate lines, and branch electrode lines connected with the main electrode line. The present disclosure reduces the overall resistance of common electrode lines by branch electrode lines connected with main electrode lines, effectively reduces the phenomenon of common electrode signal delay and improves the display quality of a display panel.

15 Claims, 7 Drawing Sheets

(51) Int. Cl.
 *G02F 1/1362* (2006.01)
 *G02F 1/1343* (2006.01)

ARRAY SUBSTRATE AND DISPLAY DEVICE

TECHNICAL FIELD

The present disclosure relates to an array substrate and a display device.

BACKGROUND

As the sizes of the current displays become larger and larger, the lengths of common electrode lines become longer and longer, and the resistance of the common electrode lines becomes also increased. Thus, the delay phenomenon of common electrode signals can become more severe, and hence the image display quality can be affected adversely.

SUMMARY

An embodiment of the present disclosure provides an array substrate, comprising: a base substrate; gate lines and data lines disposed on the base substrate; and display units defined by intercrossing of the data lines and the gate lines. Each display unit is provided with a thin-film transistor (TFT), a sub-pixel electrode and a common electrode line; and the common electrode line comprises a main electrode line, an extension direction of which is the same as an extension direction of the gate lines, and branch electrode lines connected with the main electrode line.

For example, in the array substrate according to an embodiment of the present disclosure, the branch electrode lines comprise: at least two first branch electrode lines, an extension direction of which is the same as an extension direction of the data lines; and at least one second branch electrode line, an extension direction of which is the same as the extension direction of the gate lines, in which the second branch electrode lines are connected with all the first branch electrode lines.

For example, in the array substrate according to an embodiment of the present disclosure, three first branch electrode lines are provided, in which two first branch electrode lines are respectively disposed in regions at both ends of the display unit, and one first branch electrode is disposed in an intermediate region of the display unit.

For example, in the array substrate according to an embodiment of the present disclosure, a region of the sub-pixel electrode is provided with one of the second branch electrode lines.

For example, in the array substrate according to an embodiment of the present disclosure, sub-pixel electrodes, a number of which is not less than two, are provided; the sub-pixel electrodes are connected with each other; and a region of at least one sub-pixel electrode is provided with one of the second branch electrode lines.

For example, in the array substrate according to an embodiment of the present disclosure, the sub-pixel electrode is arranged in different layers from a drain electrode of the TFT, and connected with the drain electrode of the TFT via a through hole; and the through hole is at least partially overlapped with one of the second branch electrode lines.

For example, in the array substrate according to an embodiment of the present disclosure, each display unit is provided with two sub-pixel electrodes; the two sub-pixel electrodes are spaced from each other; each sub-pixel electrode corresponds to one TFT and is respectively connected with a drain electrode of the TFT, corresponding to the sub-pixel electrode, via a through hole corresponding to the sub-pixel electrode; and each through hole is respectively at least partially overlapped with different second branch electrode lines.

For example, in the array substrate according to an embodiment of the present disclosure, two sub-pixel electrodes are provided; the two sub-pixel electrodes are spaced from each other; an extension direction of a gap between two adjacent sub-pixel electrodes is the same as the extension direction of the gate lines; and one of the second branch electrode lines is at least partially overlapped with the gap.

For example, in the array substrate according to an embodiment of the present disclosure, the sub-pixel electrode is a slit electrode and comprises a first root portion, a second root portion, branch electrodes, and slits; and the slits separate adjacent branch electrodes.

For example, in the array substrate according to an embodiment of the present disclosure, one first branch electrode line is at least partially overlapped with the second root portion; and one second branch electrode line is at least partially overlapped with the first root portion.

For example, in the array substrate according to an embodiment of the present disclosure, the common electrode line and the gate lines are arranged in a same layer.

For example, in the array substrate according to an embodiment of the present disclosure, the common electrode line further comprises: connecting lines for connecting the branch electrode lines in adjacent display units in the same row.

An embodiment of the present disclosure provides a display device, comprising any one of the above-mentioned array substrates.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

An embodiment of the present disclosure provides an array substrate. The array substrate comprises: a base substrate, gate lines and data lines disposed on the base substrate, and display units defined by the intercrossing of the data lines and the gate lines. Each display unit is provided with a thin film transistor (TFT), a sub-pixel electrode and a common electrode line. The common electrode line includes a main electrode line, the extension direction of which is the same as the extension direction of the gate line, and branch electrode lines connected with the main electrode line.

The embodiment of the present disclosure can reduce the overall resistance of the common electrode line by arranging the branch electrode lines connected with the main electrode line, solve the problem of common electrode signal delay, and hence improve the display quality of a display panel.

Description will be given below to the array substrate provided by the present disclosure with reference to several embodiments.

First Embodiment

Figure 1:
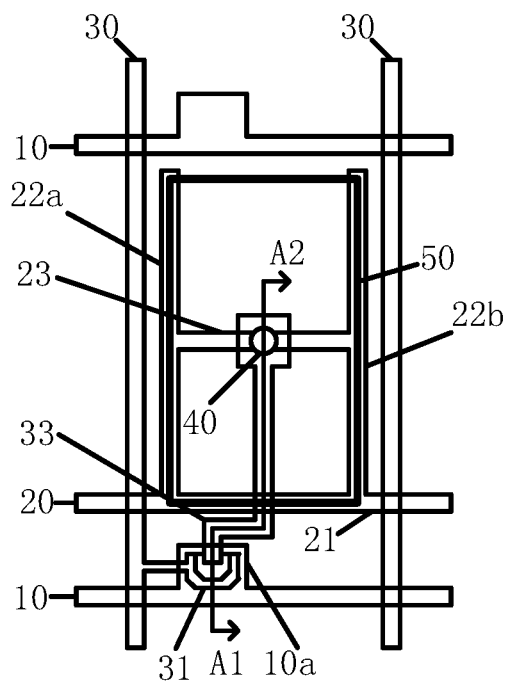
FIGS. 1 and 2 are schematic structural views of an array substrate of a first embodiment provided by the present disclosure.
Figure 2:
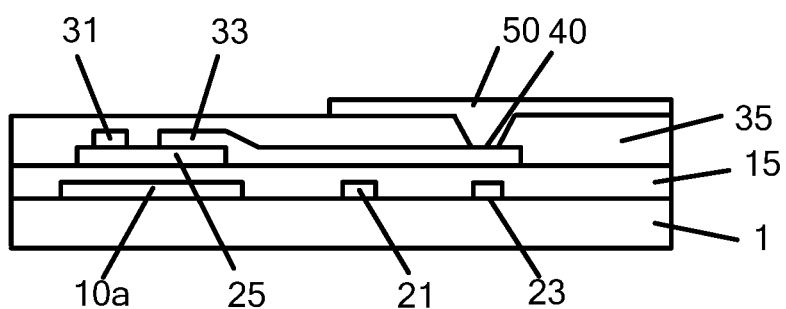

As shown in FIGS. 1 and 2, the array substrate provided by the embodiment comprises gate lines 10 and data lines 30 formed on a base substrate 1, and display units defined by the intercrossing of the data lines 30 and the gate lines 10. Each display unit further includes a TFT, a sub-pixel electrode 50 and a common electrode line 20. The common electrode line 20 includes a main electrode line 21 and branch electrode lines connected with the main electrode line 21. The branch electrode lines include first branch electrode lines 22a and 22b, the extension direction of which is the same as the extension direction of the data line 30, and a second branch electrode line 23, the extension direction of which is the same as the extension direction of the gate line 10. The second branch electrode line 23 is connected with the first branch electrode lines 22a and 22b, so that the branch electrode lines formed by the first branch electrode lines 22a and 22b and the second branch electrode line 23 can be connected with the main electrode line 21.

In the embodiment, the display unit includes a sub-pixel electrode 50 (the sub-pixel electrode in FIG. 1 is embodied in a bold-line frame), and the sub-pixel electrode 50 is connected with the data line 30 through the TFT.

For instance, the TFT includes: a gate electrode 10a, an active layer 25, a source electrode 31 and a drain electrode 33. The gate line 10a is connected or integrally formed with the gate line 10; a gate insulating layer 15 is disposed on the gate electrode 10a; the active layer 25 is disposed on the gate insulating layer 15; the source electrode 31 and the drain electrode 33 are disposed on the active layer 25; a passivation layer 35 is disposed on the source electrode 31 and the drain electrode 33; the sub-pixel electrode 50 is connected with the drain electrode 33 via a through hole 40 in a passivation layer 35; and the source electrode 31 is connected with the data line 30.

For instance, the gate insulating layer 15 may be made from silicon nitride or silicon oxide. The gate insulating layer may be in a single-layer structure or a multi-layer structure, e.g., silicon oxide/silicon nitride. The active layer 25 may be made from amorphous silicon (a-Si), polycrystalline silicon (poly-Si), microcrystal silicon or oxide semiconductors. The passivation layer 35 may be made from an inorganic material such as silicon nitride or adopt an organic insulating layer, e.g., made from an organic resin material. The sub-pixel electrode 50 is made from ITO, IZO or another transparent metal oxide conductive material.

In the embodiment, the second branch electrode line 23 is at least partially overlapped with the through hole 40. It should be noted that no limitation is given here regarding the connecting positions of the second branch electrode line 23 and the first branch electrode lines 22a and 22b.

Second Embodiment

Figure 3:
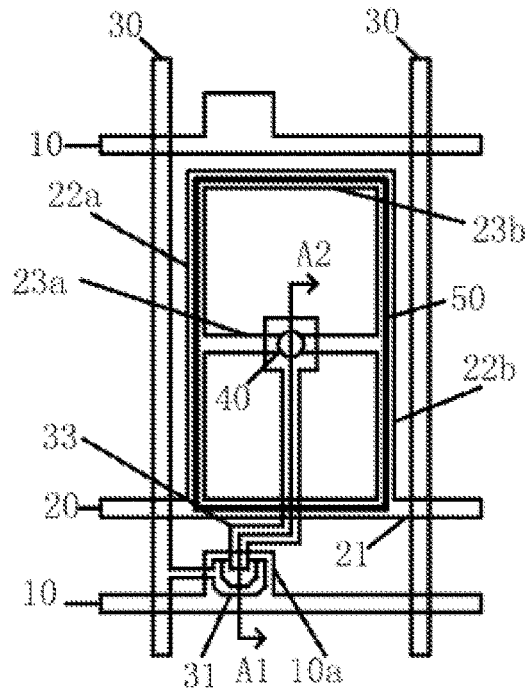
FIG. 3 is a schematic structural view of the array substrate of a second embodiment provided by the present disclosure.

As shown in FIG. 3, in the embodiment, the common electrode line 20 includes: a main electrode line 21, first branch electrode lines 22a and 22b, and second branch electrode lines 23a and 23b. The extension direction of the first branch electrode lines 22a and 22b is the same as the extension direction of the data line 30; the extension direction of the second branch electrode lines 23a and 23b is the same as the extension direction of the gate line 10; and the second branch electrode lines 23a and 23b are respectively connected with the first branch electrode lines 22a and 22b. The second branch electrode line 23a is at least partially overlapped with a through hole 40. A sub-pixel electrode 50 (the sub-pixel electrode in FIG. 3 is embodied in a bold-line frame) is connected with the drain electrode 33 of a TFT via the through hole 40.

It should be noted that the connecting positions of the second branch electrode line 23b and the first branch electrode lines 22a and 22b are not limited in the embodiment. For instance, when the first branch electrode lines 22a and 22b have an equal length, the second branch electrode line 23b may be respectively connected with end points of the first branch electrode lines 22a and 22b. Or when the first branch electrode lines 22a and 22b have unequal lengths, the second branch electrode line 23b is connected with an end point of one of the first branch electrode lines 22a and 22b with a shorter length, and connected with a non-end point position of one of the first branch electrode lines 22a and 22b with a longer length.

Third Embodiment

Figure 4:
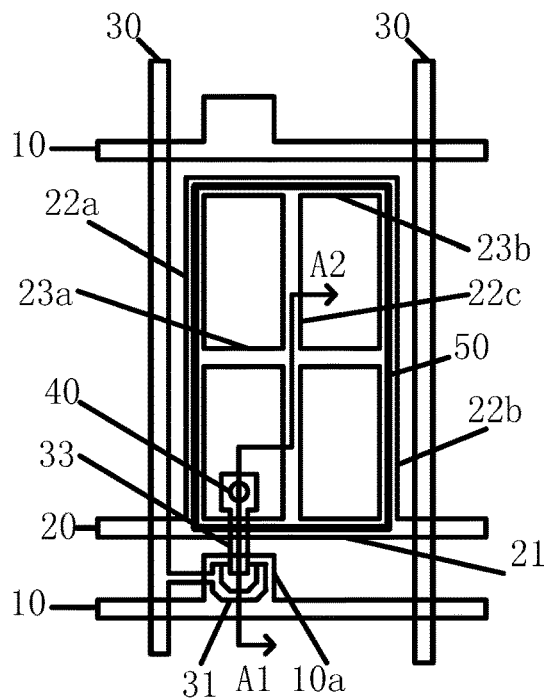
FIG. 4 is a schematic structural view of the array substrate of a third embodiment provided by the present disclosure.

As shown in FIG. 4, in the embodiment, the common electrode line 20 includes: a main electrode line 21, first branch electrode lines 22a, 22b and 22c, and second branch electrode lines 23a and 23b. The extension direction of the first branch electrode lines 22a, 22b and 22c is the same as the extension direction of the data line 30; the extension direction of the second branch electrode lines 23a and 23b is the same as the extension direction of the gate line 10; and the second branch electrode lines 23a and 23b are respectively connected with the first branch electrode lines 22a, 22b and 22c.

For instance, in the embodiment, the gate lines 10 and the data lines 30 are intersected with each other to define display units. For instance, as shown in FIG. 4, the first branch electrode liens 22a and 22b are respectively disposed in regions at both ends of the display unit, and the first branch electrode line 22c is disposed in an intermediate region of the display unit.

In addition, the display unit provided by the embodiment is also provided with a sub-pixel electrode 50 (the sub-pixel electrode in FIG. 4 is embodied in a bold-line frame), and the sub-pixel electrode 50 is connected with the drain electrode 33 of a TFT via a through hole 40.

The difference with the second embodiment is that the embodiment comprises two second branch electrode lines, and the second branch electrode lines are not at least partially overlapped with the through hole 40.

Fourth Embodiment

Figure 5:
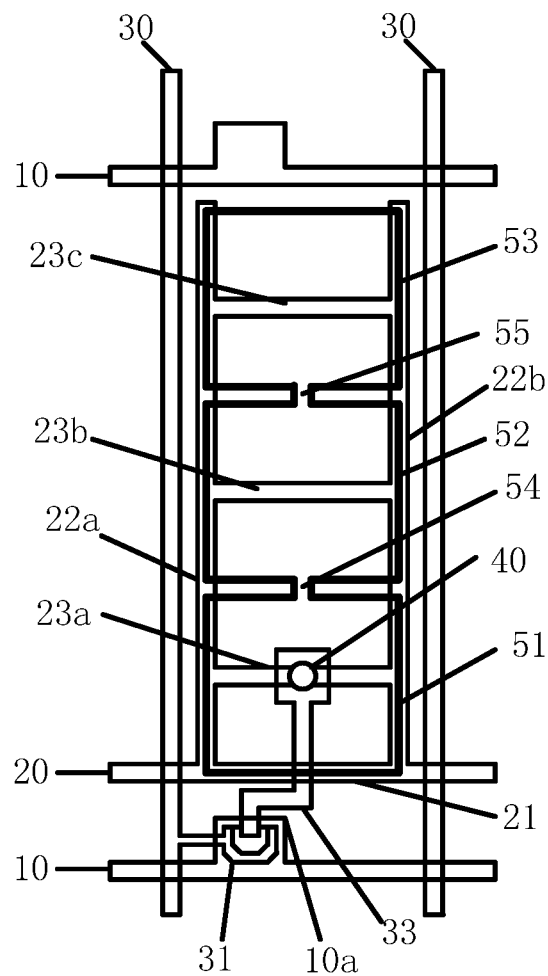
FIG. 5 is a schematic structural view of the array substrate of a fourth embodiment provided by the present disclosure.

As shown in FIG. 5, in the array substrate provided by the embodiment, the common electrode line 20 includes: a main electrode line 21, first branch electrode lines 22a and 22b, and second branch electrode lines 23a, 23b and 23c. The extension direction of the first branch electrode lines 22a and 22b is the same as the extension direction of the data line 30; the extension direction of the second branch electrode lines 23a, 23b and 23c is the same as the extension direction of the gate line 10; and the second branch electrode lines 23a, 23b and 23c are respectively connected with the first branch electrode lines 22a and 22b.

For instance, the display unit defined by the intercrossing of the data lines 30 and the gate lines 10 includes sub-pixel electrodes 51, 52 and 53 (a sub-pixel in FIG. 5 is embodied in a bold-line frame). The sub-pixel electrode 51 is connected with the sub-pixel electrode 52 through a connecting portion 54, and the sub-pixel electrode 52 is connected with the sub-pixel electrode 53 through a connecting portion 55. The sub-pixel electrodes 51, 52 and 53 are integrally formed with the connecting portions 54 and 55.

For example, one corresponding second branch electrode line is disposed in each of the regions of the sub-pixel electrodes 51, 52 and 53 in the embodiment. As shown in FIG. 5, the sub-pixel electrode 51 is correspondingly provided with the second branch electrode line 23a; the sub-pixel electrode 52 is correspondingly provided with the second branch electrode line 23b; and the sub-pixel electrode 53 is correspondingly provided with the second branch electrode line 23c. Of course, in other feasible proposals, in the embodiment, only regions of part of sub-pixel electrodes are provided with the second branch electrode lines, for instance, one second branch electrode line is respectively disposed below the sub-pixel electrode 51 and the sub-pixel electrode 52; or one second branch electrode line is respectively disposed below the sub-pixel electrode 51 and the sub-pixel electrode 53; or one second branch electrode line is respectively disposed below the sub-pixel electrode 52 and the sub-pixel electrode 53. No further description will be given here one by one.

In the embodiment, the sub-pixel electrode 51 is connected with the drain electrode 33 of a TFT via a through hole 40, so that a data line signal from the drain electrode 33 can be applied to the sub-pixel electrodes 51, 52 and 53 together.

For instance, as shown in FIG. 5, the second branch electrode line 23a corresponding to the sub-pixel electrode 51 is at least partially overlapped with the through hole 40.

Fifth Embodiment

Figure 6:
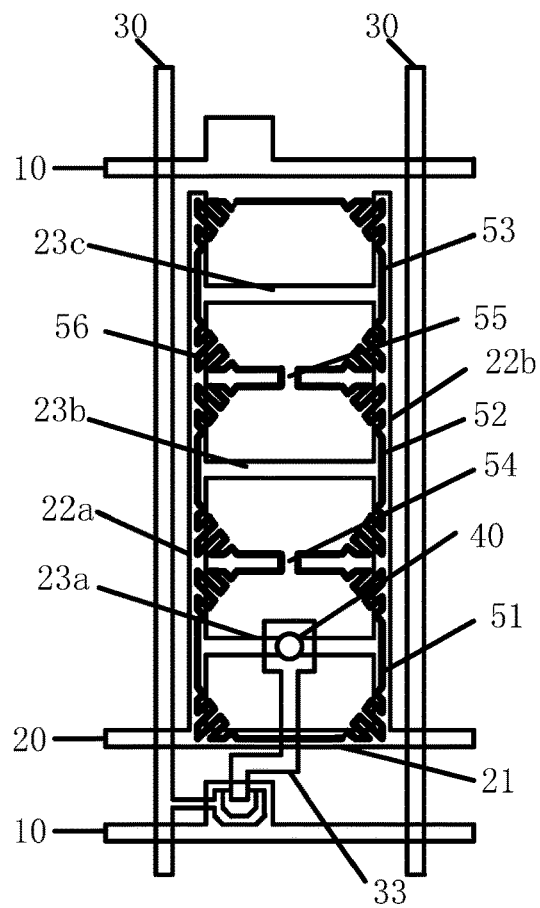
FIG. 6 is a schematic structural view of the array substrate of a fifth embodiment provided by the present disclosure.

As shown in FIG. 6, the difference from the fourth embodiment is that main bodies of sub-pixel electrodes 51, 52 and 53 (the sub-pixel electrode in FIG. 6 is represented by a bold-line frame) in the embodiment may be plate electrodes, and strip electrodes 56 are formed at edges of the plate electrodes.

It should be noted that the sub-pixel electrodes in the embodiment of the present disclosure are not limited to the shape as shown in FIGS. 1 to 6.

Sixth Embodiment

Figure 7:
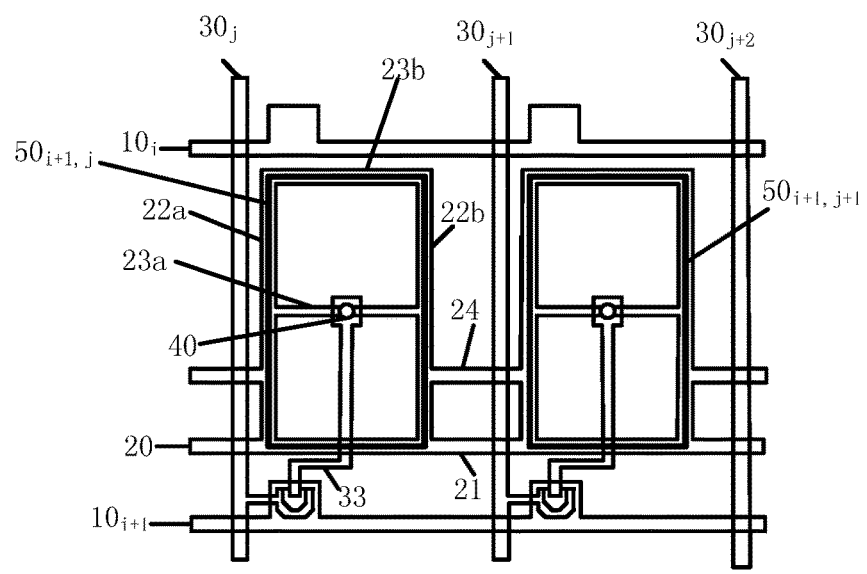
FIG. 7 is a schematic structural view of the array substrate of a sixth embodiment provided by the present disclosure.

As shown in FIG. 7, the array substrate provided by the embodiment comprises: gate lines $10i$ and $10i+1$ and data lines $30j$, $30j+1$ and $30j+2$; a first display unit is encircled by the gate lines $10i$ and $10i+1$ and the data lines $30j$ and $30j+1$, and a sub-pixel electrode $50i+1$, j is disposed in the first display unit. Similarly, a second display unit in the same row with the first display unit is encircled by the gate lines $10i$ and $10i+1$ and the data lines $30j+1$ and $30j+2$, and a sub-pixel electrode $50i+1$, j+1 is disposed in the second display unit.

For instance, common electrode lines 20 are also disposed on the array substrate provided by the embodiment. A common electrode line 20 includes a main electrode line 21 and branch electrode lines respectively corresponding to the first display unit and the second display unit.

Taking the branch electrode line of the first display unit as an example, the branch electrode line of the first display unit includes: first branch electrode lines 22a and 22b, the extension direction of which is the same as the extension direction of the data lines $30j$, $30j+1$ and $30j+2$, and second branch electrode lines 23a and 23b, the extension direction of which is the same as the extension direction of the gate lines $10i$ and $10i+1$. The sub-pixel electrode $50i+1$, j is connected with the drain electrode 33 of a TFT via a through hole 40. For instance, the second branch electrode line 23a is at least partially overlapped with the through hole 40.

In addition, as shown in FIG. 7, in the embodiment, the resistance of the common electrode line 20 is further reduced; the branch electrode lines of the first display unit and the second display unit are connected with each other through connecting electrodes 24; and the connecting electrodes 24 and the common electrode line 20 are integrally formed.

Seventh Embodiment

Figure 8:
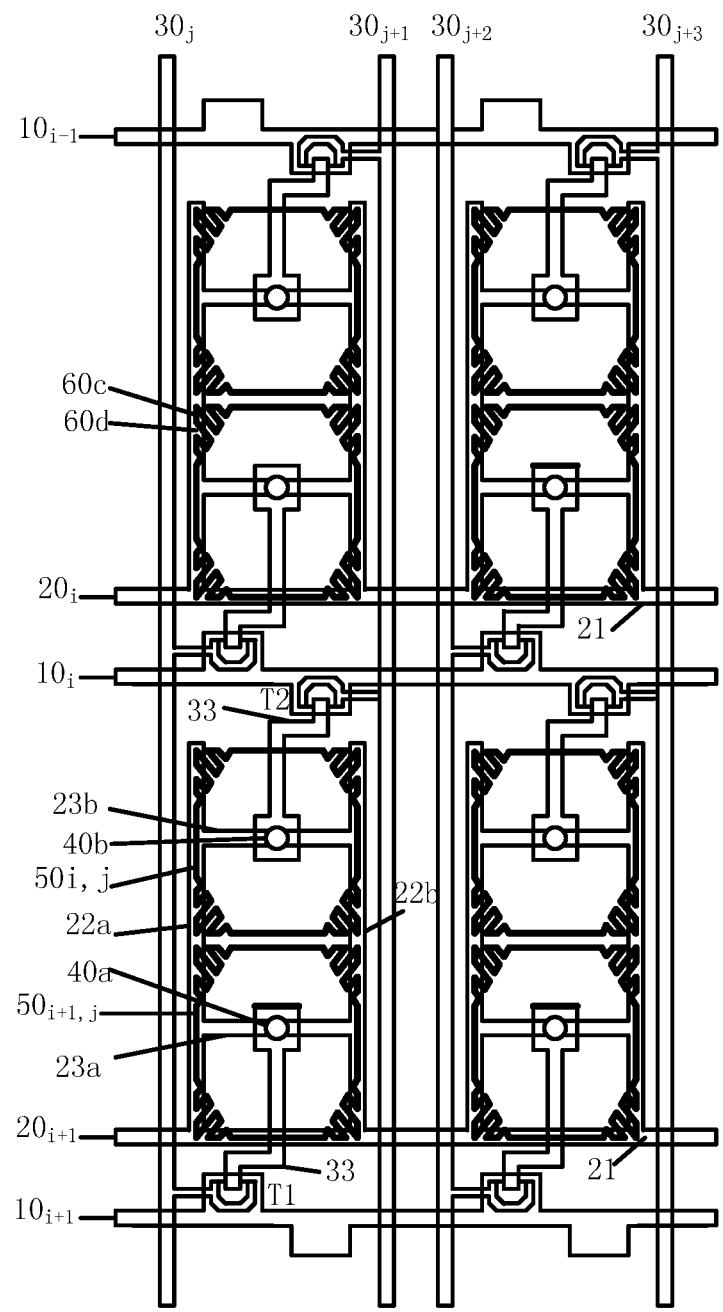
FIG. 8 is a schematic structural view of the array substrate of a seventh embodiment provided by the present disclosure.

As shown in FIG. 8, the array substrate provided by the embodiment comprises: gate lines $10i-1$, $10i$ and $10i+1$, data lines $30j$, $30j+1$, $30j+2$ and $30j+3$, and common electrode lines $20i$ and $20i+1$; four display units are encircled by the gate lines $10i-1$, $10i$ and $10i+1$ and the data lines $30j$, $30j+1$, $30j+2$ and $30j+3$; each display unit is correspondingly provided with two sub-pixel electrodes which are adjacent to each other and are respectively on the upper and lower sides (the sub-pixel electrode in FIG. 8 is embodied in a bold-line frame); branch electrode lines are respectively extended from a main electrode line 21 of the common electrode line $20i$ in regions of two display units on the upper left and the upper right; and branch electrode lines are respectively extended from a main electrode line 21 of the common electrode line $20i+1$ in regions of two display units on the lower left and the lower right.

Taking the display unit on the lower left as an example, the branch electrode lines of the common electrode line $20i+1$ include: first branch electrode lines 22a and 22b, the extension direction of which is the same as the extension direction of the data lines $30j$ and $30j+1$, and second branch electrode lines 23a and 23b, the extension direction of which is the same as the extension direction of the gate lines $10i$ and $10i+1$. For instance, the display unit on the lower left includes: sub-pixel electrodes $50i, j$ and $50i+1, j$, which are adjacent to each other on the upper and lower sides and spaced from each other. The sub-pixel electrode 50$i$+1, j is connected with the drain electrode 33 of the TFT T1 on the lower part via a through hole 40$a$; and the sub-pixel electrode 50$i$, j is connected with the drain electrode 33 of the TFT T2 on the lower part via a through hole 40$b$.

Correspondingly, the second branch electrode line 23$a$ is disposed in a region of the sub-pixel electrode 50$i$+1, j, and is at least partially overlapped with the through hole 40$a$. Similarly, the second branch electrode line 22$b$ is disposed in a region of the sub-pixel electrode 50$i$, j, and is at least partially overlapped with the through hole 40$b$.

For instance, the sub-pixel electrode in the embodiment may be a plate electrode, of which the edges are provided with strip electrodes 60$c$, and slits 60$d$ are formed between the strip electrodes 60$c$.

Eighth Embodiment

Figure 9:
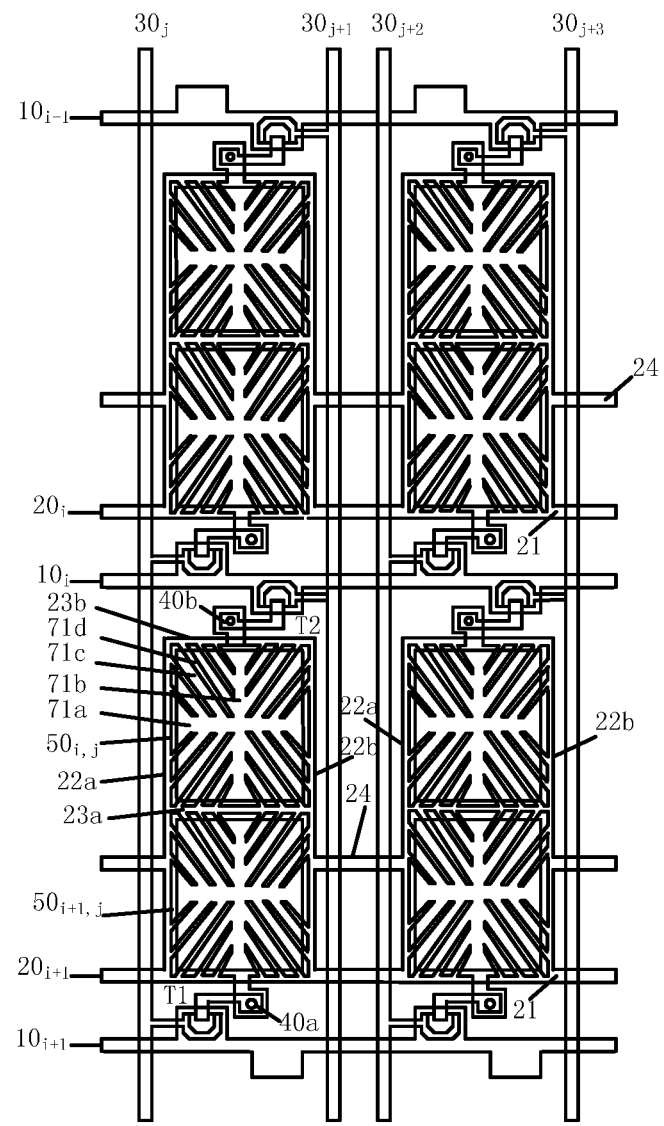
FIG. 9 is a schematic structural view of the array substrate of an eighth embodiment provided by the present disclosure.

As shown in FIG. 9, the array substrate provided by the embodiment comprises: gate lines 10$i$-1, 10$i$ and 10$i$+1, data lines 30$j$, 30$j$+1, 30$j$+2 and 30$j$+3, and common electrode lines 20$i$ and 20$i$+1. Four display units are encircled by the gate lines 10$i$-1, 10$i$ and 10$i$+1 and the data lines 30$j$, 30$j$+1, 30$j$+2 and 30$j$+3; each display unit is correspondingly provided with two sub-pixel electrodes which are adjacent to each other and respectively on the upper and lower sides; branch electrode lines are respectively extended from a main electrode line 21 of the common electrode line 20$i$ in regions of two display units on the upper left and the upper right; and branch electrode lines are respectively extended from a main electrode line 21 of the common electrode line 20$i$+1 in regions of two display units on the lower left and the lower right.

Taking the display unit on the lower left as an example, the branch electrode lines of the common electrode line 20$i$+1 include: first branch electrode lines 22$a$ and 22$b$, the extension direction of which is the same as the extension direction of the data lines 30$j$ and 30$j$+1, and second branch electrode lines 23$a$ and 23$b$, the extension direction of which is the same as the extension direction of the gate lines 10$i$ and 10$i$+1. The display unit on the lower left includes: sub-pixel electrodes 50$i$, j and 50$i$+1, j, which are adjacent to each other on the upper and lower sides and spaced from each other. The sub-pixel electrode 50$i$+1, j is connected with the drain electrode 33 of the TFT T1 on the lower part via a through hole 40$a$, and the sub-pixel electrode 50$i$, j is connected with the drain electrode 33 of a TFT T2 on the upper part via a through hole 40$b$.

Correspondingly, the second branch electrode line 23$a$ is disposed in a region of the sub-pixel electrode 50$i$+1, j. For instance, the second branch electrode line 23$a$ is at least partially overlapped with the through hole 40$a$ Similarly, the second branch electrode line 22$b$ is disposed in a region of the sub-pixel electrode 50$i$, j. For instance, the second branch electrode line 22$b$ is at least partially overlapped with the through hole 40$b$.

For instance, the first branch electrode lines 22$a$ and 22$b$ are respectively disposed on the left and right sides of the sub-pixel electrode 50$i$, j and the sub-pixel electrode 50$i$+1, j; the extension direction of the gap between two adjacent sub-pixel electrodes 50$i$, j and 50$i$+1, j is the same as the extension direction of the gate line; the second branch electrode line 23$a$ is at least partially overlapped with the gap; and the other second branch electrode line 23$b$ is connected with end points of the first branch electrode lines 22$a$ and 22$b$.

As shown in FIG. 9, illustratively, the sub-pixel electrode in the embodiment is, for instance, a fine slit electrode. The sub-pixel electrode includes a first root portion 71$a$, a second root portion 71$b$, branch electrodes 71$c$, and slits 71$d$. The slits 71$d$ separate adjacent branch electrodes 71$c$.

In addition, the array substrate provided by the embodiment further comprises connecting electrodes 24, which are integrally formed with the common electrode lines 20. The connecting electrodes 24 are configured to connect branch electrode lines in different display regions.

Ninth Embodiment

Figure 10:
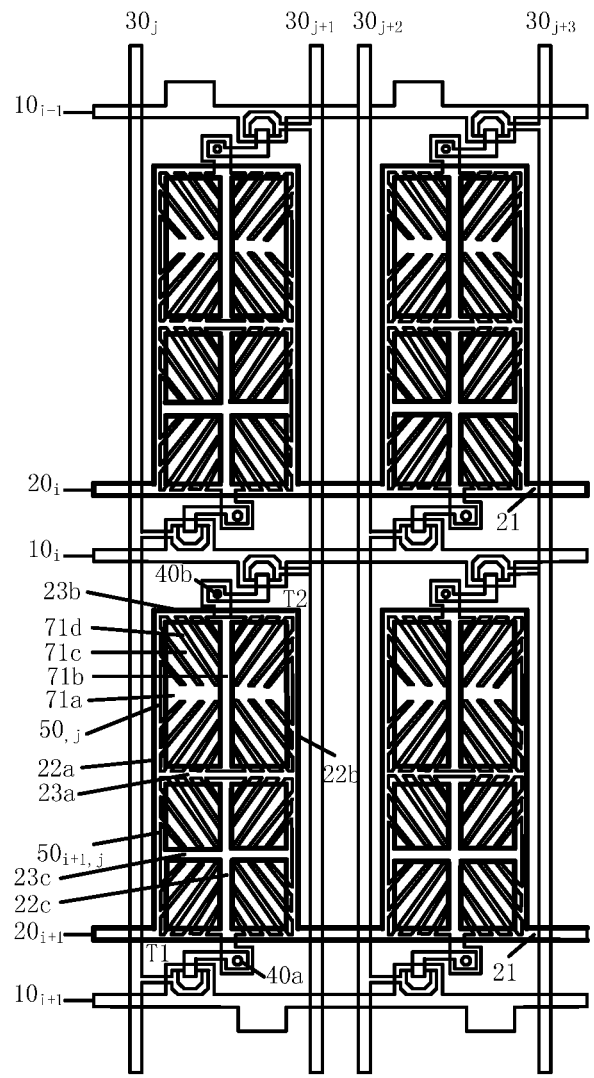
FIG. 10 is a schematic structural view of the array substrate of a ninth embodiment provided by the present disclosure.

As shown in FIG. 10, the array substrate provided by the embodiment comprises: gate lines 10$i$-1, 10$i$ and 10$i$+1, data lines 30$j$, 30$j$+1, 30$j$+2 and 30$j$+3, and common electrode lines 20$i$ and 20$i$+1 (the common electrode lines are embodied in bold-line frames in FIG. 10). Four display units are encircled by the gate lines 10$i$-1, 10$i$ and 10$i$+1 and the data lines 30$j$, 30$j$+1, 30$j$+2 and 30$j$+3; each display unit is correspondingly provided with two sub-pixel electrodes, which are adjacent to each other and respectively on the upper and lower sides; branch electrode lines are respectively extended from a main electrode line 21 of the common electrode line 20$i$ in regions of two display units on the upper left and the upper right; and branch electrode lines are respectively extended from a main electrode line 21 of the common electrode line 20$i$+1 in regions of two display units on the lower left and the lower right.

Taking the display unit on the lower left as an example, the branch electrode lines of the common electrode line 20$i$+1 include: first branch electrode lines 22$a$, 22$b$ and 22$c$, the extension direction of which is the same as the extension direction of the data lines 30$j$ and 30$j$+1, and second branch electrode lines 23$a$, 23$b$ and 23$c$, the extension direction of which is the same as the extension direction of the gate lines 10$i$ and 10$i$+1. For instance, the display unit on the lower left includes: sub-pixel electrodes 50$i$, j and 50$i$+1, j, which are adjacent to each other and respectively on the upper and lower sides and spaced from each other. For instance, the sub-pixel electrode 50$i$+1, j is connected with the drain electrode 33 of the TFT T1 on the lower side via a through hole 40$a$, and the sub-pixel electrode 50$i$, j is connected with the drain electrode 33 of the TFT T2 on the upper side via a through hole 40$b$.

As shown in FIG. 10, the sub-pixel electrodes in the embodiment (for instance, the sub-pixel electrodes 50$i$, j and 50$i$+1, j) are fine slit electrodes. The sub-pixel electrode includes a first root portion 71$a$, a second root portion 71$b$, branch electrodes 71$c$, and slits 71$d$. The slits 71$d$ separate adjacent branch electrodes 71$c$.

For instance, the first branch electrode lines 22$a$ and 22$b$ are respectively disposed on the left and right sides of the sub-pixel electrodes 50$i$, j and 50$i$+1, j, and the first branch electrode line 22$c$ is at least partially overlapped with the second root portion 71$b$. In addition, in the embodiment, the extension direction of the gap between two adjacent sub-pixel electrodes 50$i$, j and 50$i$+1, j is the same as the extension direction of the gate line, and the second branch electrode line 23$a$ is at least partially overlapped with the gap. The second branch electrode line 23$b$ is connected with end points of the first branch electrode lines 22$a$ and 22$b$, and the second branch electrode line 23$c$ is at least partially overlapped with the first root portion 71$a$ of the sub-pixel electrode 50$i$+1, j.

It should be noted that the common electrode line in the embodiment may also include more first branch electrode lines and second branch electrode lines, and the first branch electrode lines or the second branch electrode lines are not necessarily required to have an equal length or width.

Tenth Embodiment

The embodiment of the present disclosure further provides a display device comprising the array substrate according to any one of embodiments 1 to 9. In the display device, the overall resistance of the common electrode lines is reduced, so the phenomenon of common electrode signal delay in the display device provided by any one of the embodiments can be reduced, and hence the display quality can be higher than that of a current display device.

For instance, the display device provided by the embodiment may be: any product or component with display function such as a mobile phone, a tablet PC, a TV, a display, a notebook computer, a digital picture frame and a navigator.

Embodiments of the present disclosure provide an array substrate and a display device, which reduce the overall resistance of common electrode lines by arranging branch electrode lines connected with main electrode lines, effectively reduce the phenomenon of common electrode signal delay, and hence improve the display quality of a display panel.

Obviously, various modifications or deformations may be made to the present disclosure by those skilled in the art without departing from the spirit and the scope of the present disclosure. If the modifications or deformations fall within the scope of the appended claims of the present disclosure and equivalent technologies thereof, the present disclosure is also intended to include the modifications or deformations.

What are described above is related to the illustrative embodiments of the disclosure only and not limitative to the scope of the disclosure; the scopes of the disclosure are defined by the accompanying claims.

The application claims priority to the Chinese patent application No. 201520977392.7, filed on Dec. 1, 2015, the entire disclosure of which is incorporated herein by reference as part of the present application.

What is claimed is:

1. An array substrate, comprising:
   a base substrate;
   gate lines and data lines disposed on the base substrate; and
   display units defined by intercrossing of the data lines and the gate lines, in which each display unit is provided with a thin-film transistor (TFT), at least one sub-pixel electrode and a common electrode line; and
   the common electrode line comprises a main electrode line, an extension direction of which is the same as an extension direction of the gate lines, and branch electrode lines connected with the main electrode line;
   wherein the branch electrode lines comprise:
   at least two first branch electrode lines, which protrude from the main electrode line at a same side and extends in a same direction as an extension direction of the data lines; and
   at least one second branch electrode line, an extension direction of which is the same as the extension direction of the gate lines, in which the second branch electrode lines are connected with all the first branch electrode lines.

2. The array substrate according to claim 1, wherein three first branch electrode lines are provided, in which two first branch electrode lines are respectively disposed in regions at both ends of the display unit, and one first branch electrode is disposed in an intermediate region of the display unit.

3. The array substrate according to claim 2, wherein a region of the sub-pixel electrode is provided with one of the second branch electrode lines.

4. The array substrate according to claim 2, wherein the at least one sub-pixel electrode is a slit electrode and comprise a first root portion, a second root portion, branch electrodes, and slits; and the slits separate adjacent branch electrodes.

5. The array substrate according to claim 4, wherein one first branch electrode line is at least partially overlapped with the second root portion; and one second branch electrode line is at least partially overlapped with the first root portion.

6. The array substrate according to claim 1, wherein a region of the sub-pixel electrode is provided with one of the second branch electrode lines.

7. The array substrate according to claim 1, wherein a number of the at least one sub-pixel electrode is at least two; the at least two sub-pixel electrodes are connected with each other; and a region of at least one sub-pixel electrode among the at least two sub-pixel electrodes is provided with one of the second branch electrode lines.

8. The array substrate according to claim 1, wherein the at least one sub-pixel electrode is arranged in different layers from a drain electrode of the TFT, and connected with the drain electrode of the TFT via a through hole; and
the through hole is at least partially overlapped with one of the second branch electrode lines.

9. The array substrate according to claim 8, wherein each display unit is provided with two sub-pixel electrodes; the two sub-pixel electrodes are spaced from each other; each sub-pixel electrode of the two sub-pixel electrodes corresponds to one TFT and is respectively connected with a drain electrode of the TFT corresponding to the sub-pixel electrode, via a through hole corresponding to the sub-pixel electrode; and each through hole is respectively at least partially overlapped with different second branch electrode lines.

10. The array substrate according to claim 1, wherein the at least one sub-pixel electrode comprises two sub-pixel electrodes; the two sub-pixel electrodes are spaced from each other; an extension direction of a gap between two adjacent sub-pixel electrodes is the same as the extension direction of the gate lines; and one of the second branch electrode lines is at least partially overlapped with the gap.

11. The array substrate according to claim 1, wherein the at least one sub-pixel electrode is a slit electrode and comprise a first root portion, a second root portion, branch electrodes, and slits; and the slits separate adjacent branch electrodes.

12. The array substrate according to claim 11, wherein the at least two first branch electrode lines are at least partially overlapped with the second root portion; and the at least one second branch electrode line is at least partially overlapped with the first root portion.

13. The array substrate according to claim 1, wherein the common electrode line and the gate lines are arranged in a same layer.

14. The array substrate according to claim 13, wherein the common electrode line further comprises: connecting lines for connecting the branch electrode lines in adjacent display units in the same row.

15. A display device, comprising the array substrate according to claim 1.

\* \* \* \* \*